(12) United States Patent
Ahmed et al.

(10) Patent No.: US 10,193,018 B2
(45) Date of Patent: Jan. 29, 2019

(54) COMPACT LOW POWER HEAD-MOUNTED DISPLAY WITH LIGHT EMITTING DIODES THAT EXHIBIT A DESIRED BEAM ANGLE

(71) Applicant: Intel Corporation, Santa Clara, CA (US)

(72) Inventors: Khaled Ahmed, Anaheim, CA (US); Kunjal Parikh, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 72 days.

(21) Appl. No.: 15/393,885

(22) Filed: Dec. 29, 2016

(65) Prior Publication Data

US 2018/0190865 A1 Jul. 5, 2018

(51) Int. Cl.
| | |
|---|---|
| *G09G 3/32* | (2016.01) |
| *H01L 33/20* | (2010.01) |
| *H01L 33/24* | (2010.01) |
| *H01L 33/44* | (2010.01) |
| *H01L 33/46* | (2010.01) |
| *H01L 33/00* | (2010.01) |
| *H01L 33/58* | (2010.01) |
| *H01L 27/15* | (2006.01) |
| *G09G 3/00* | (2006.01) |
| *H01L 27/12* | (2006.01) |

(52) U.S. Cl.
CPC ............ *H01L 33/20* (2013.01); *G09G 3/002* (2013.01); *G09G 3/32* (2013.01); *H01L 27/156* (2013.01); *H01L 33/005* (2013.01); *H01L 33/24* (2013.01); *H01L 33/44* (2013.01); *H01L 33/46* (2013.01); *H01L 33/58* (2013.01); *G09G 2320/0626* (2013.01); *H01L 27/1214* (2013.01); *H01L 2933/0025* (2013.01)

(58) Field of Classification Search
None
See application file for complete search history.

(56) References Cited

U.S. PATENT DOCUMENTS

| | | | | |
|---|---|---|---|---|
| 6,091,195 | A * | 7/2000 | Forrest | H01L 51/5271 313/504 |
| 6,410,942 | B1 * | 6/2002 | Thibeault | H01L 33/08 257/88 |
| 7,982,205 | B2 * | 7/2011 | Wang | H01L 33/0079 257/103 |
| 9,086,211 | B2 * | 7/2015 | Duong | A01G 7/045 |
| 9,653,642 | B1 * | 5/2017 | Raring | H01L 33/0075 |
| 9,865,577 | B2 * | 1/2018 | Bibl | H01L 25/167 |

(Continued)

*Primary Examiner* — Chad M Dicke
(74) *Attorney, Agent, or Firm* — International IP Law Group, P.L.L.C.

(57) ABSTRACT

A display panel is described which includes Light Emitting Diodes (LEDs) that exhibit a specified beam angle. The display panel can be used for a head-mounted display. An example of a head-mounted display includes a display panel with an array of LEDs that are controllable to form an image. The head-mounted display also includes circuitry to receive image data and render an image on the display panel. The head-mounted display also includes circuitry to detect motion of the head-mounted display. The image data is generated based in part on the motion of the head-mounted display. Each LED in the array of LEDs is configured to emit light at a specified beam angle that directs the light toward a pupil of a wearer of the head-mounted display.

23 Claims, 8 Drawing Sheets

(56) References Cited

U.S. PATENT DOCUMENTS

| | | | |
|---|---|---|---|
| 2002/0134987 A1* | 9/2002 | Takaoka | G02B 6/4202 257/98 |
| 2003/0087467 A1* | 5/2003 | Oohata | H01L 33/22 438/47 |
| 2004/0113167 A1* | 6/2004 | Bader | H01L 33/20 257/98 |
| 2004/0188689 A1* | 9/2004 | Shono | H01L 33/387 257/79 |
| 2005/0127390 A1* | 6/2005 | Lin | H01L 33/54 257/100 |
| 2005/0285133 A1* | 12/2005 | Hung | G02B 27/0944 257/99 |
| 2006/0097385 A1* | 5/2006 | Negley | H01L 33/486 257/722 |
| 2006/0237739 A1* | 10/2006 | Shono | H01L 33/387 257/98 |
| 2006/0284205 A1* | 12/2006 | Liu | H01L 33/08 257/98 |
| 2007/0069218 A1* | 3/2007 | Chen | H01L 27/15 257/79 |
| 2007/0075321 A1* | 4/2007 | Konno | H01L 33/14 257/86 |
| 2007/0096130 A1* | 5/2007 | Schiaffino | H01L 33/0079 257/98 |
| 2007/0108459 A1* | 5/2007 | Lu | H01L 33/22 257/98 |
| 2007/0152230 A1* | 7/2007 | Duong | H01L 33/58 257/98 |
| 2007/0200135 A1* | 8/2007 | Wang | H01L 33/0079 257/103 |
| 2008/0006831 A1* | 1/2008 | Ng | H01L 33/20 257/79 |
| 2008/0029773 A1* | 2/2008 | Jorgenson | H01L 33/105 257/94 |
| 2008/0237619 A1* | 10/2008 | Epler | H01L 33/16 257/98 |
| 2008/0315235 A1* | 12/2008 | Murazaki | C09K 11/0883 257/98 |
| 2009/0273920 A1* | 11/2009 | Song | G02F 1/133603 362/97.1 |
| 2010/0053046 A1* | 3/2010 | Nakanishi | G09G 3/3426 345/82 |
| 2010/0149073 A1* | 6/2010 | Chaum | G02B 27/0093 345/8 |
| 2010/0265981 A1* | 10/2010 | Hiroyama | H01L 33/007 372/49.01 |
| 2011/0037083 A1* | 2/2011 | Chan | H01L 33/486 257/89 |
| 2011/0180824 A1* | 7/2011 | Tan | F21V 3/00 257/89 |
| 2011/0233521 A1* | 9/2011 | Saxler | H01L 21/02458 257/24 |
| 2011/0297955 A1* | 12/2011 | Wang | H01L 33/24 257/76 |
| 2012/0105310 A1* | 5/2012 | Sverdrup | G02B 27/017 345/8 |
| 2012/0211783 A1* | 8/2012 | Horng | H01L 25/0753 257/93 |
| 2013/0010465 A1* | 1/2013 | Wang | F21V 13/10 362/235 |
| 2013/0141312 A1* | 6/2013 | Horberg | G02B 7/002 345/8 |
| 2013/0300637 A1* | 11/2013 | Smits | G03B 35/18 345/8 |
| 2013/0341658 A1* | 12/2013 | Lee | H01L 33/14 257/91 |
| 2014/0070245 A1* | 3/2014 | Haberern | H01L 33/08 257/93 |
| 2015/0083990 A1* | 3/2015 | Fu | H01L 33/06 257/13 |
| 2015/0236201 A1* | 8/2015 | Shepherd | H01L 33/24 257/88 |
| 2015/0252960 A1* | 9/2015 | Song | H05B 33/086 315/186 |
| 2015/0316229 A1* | 11/2015 | Jurik | F21V 5/007 362/237 |
| 2016/0062023 A1* | 3/2016 | Itoh | G02B 6/0068 362/608 |
| 2016/0172535 A1* | 6/2016 | Choi | H01L 33/32 257/76 |
| 2016/0180821 A1* | 6/2016 | Chang | G09G 3/3413 345/531 |
| 2016/0252667 A1* | 9/2016 | Zhu | G02B 6/003 362/608 |
| 2016/0276326 A1* | 9/2016 | Natarajan | H01L 25/167 |
| 2016/0353091 A1* | 12/2016 | Li | G02B 27/2214 |
| 2017/0078623 A1* | 3/2017 | Hilkes | H04N 7/185 |
| 2017/0133818 A1* | 5/2017 | Cok | G02B 5/0242 |
| 2017/0139213 A1* | 5/2017 | Schmidtlin | G02B 27/0172 |
| 2017/0148958 A1* | 5/2017 | Yamada | H01L 33/20 |
| 2017/0186366 A1* | 6/2017 | Parikh | G09G 3/32 |
| 2017/0186843 A1* | 6/2017 | Hosaka | C04B 35/453 |
| 2017/0242251 A1* | 8/2017 | Border | G02B 27/0172 |
| 2017/0243319 A1* | 8/2017 | Wittenbrink | G06F 9/451 |
| 2017/0309678 A1* | 10/2017 | Yang | H01L 27/156 |
| 2017/0316736 A1* | 11/2017 | Hughes | G09G 3/32 |
| 2017/0330998 A1* | 11/2017 | Park, II | H01L 33/0079 |
| 2017/0331020 A1* | 11/2017 | Oh | H01L 33/42 |
| 2017/0343187 A1* | 11/2017 | Nakamura | F21V 7/04 |
| 2018/0075814 A1* | 3/2018 | Parikh | G09G 3/3622 |
| 2018/0090058 A1* | 3/2018 | Chen | G09G 3/32 |

\* cited by examiner

200

300

700

COMPACT LOW POWER HEAD-MOUNTED DISPLAY WITH LIGHT EMITTING DIODES THAT EXHIBIT A DESIRED BEAM ANGLE

TECHNICAL FIELD

The present disclosure relates generally to techniques for fabricating a display panel for a head-mounted display. More specifically, the present techniques relate to a display panel that is fabricated with (Light Emitting Diode) LEDs that exhibit a desired beam angle.

BACKGROUND ART

Virtual reality systems provide a person with the feeling of actually being immersed in a particular computer-generated virtual environment. The typical virtual reality system includes a head-mounted display, which includes circuitry to track the user's head movements and adjust the displayed image based on the point of view indicated by the user's head movement. The virtual reality system may also include circuitry to receive user input that enable the user to manipulate objects in the virtual environment and move within the virtual movement. Such virtual reality systems have applications in video game systems, entertainment, simulation of actual environments, and others.

BRIEF DESCRIPTION OF THE DRAWINGS

The same numbers are used throughout the disclosure and the figures to reference like components and features. Numbers in the 100 series refer to features originally found in FIG. 1; numbers in the 200 series refer to features originally found in FIG. 2; and so on.

DESCRIPTION OF THE EMBODIMENTS

Figure 1:
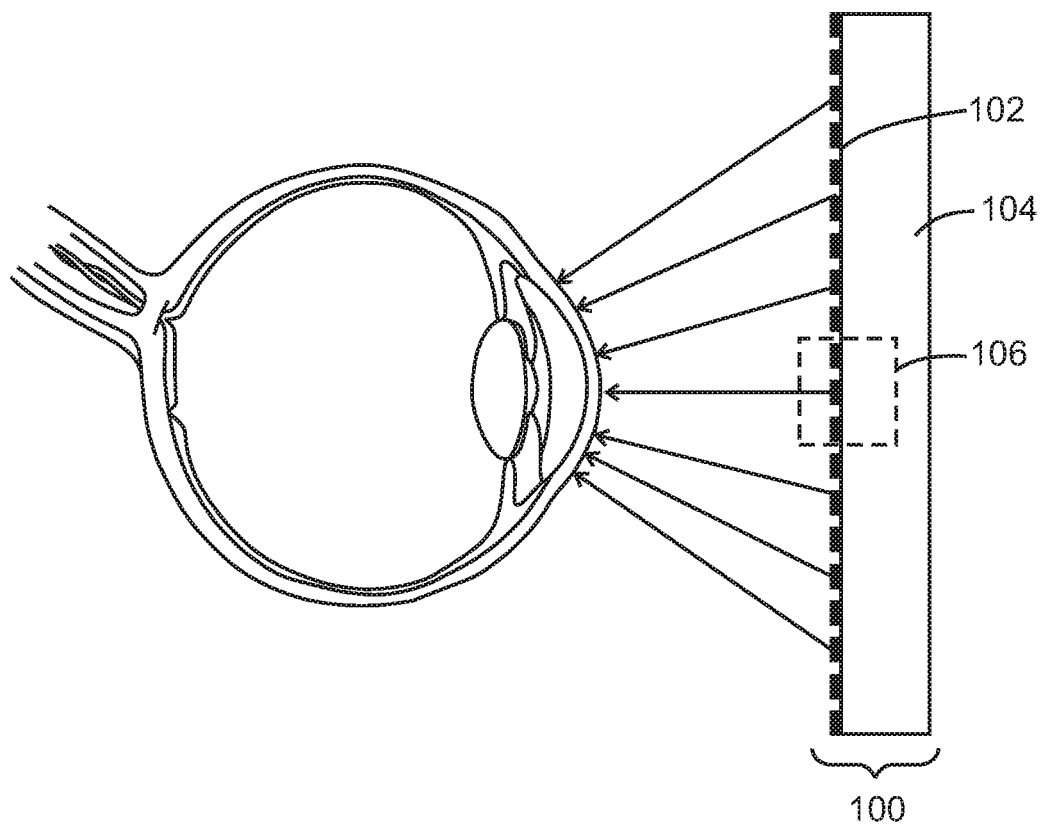
FIG. 1 is a cross sectional view of an LED display panel.

The subject matter disclosed herein relates to techniques for adjusting the radiation pattern of a display. The display described herein may be useful in head-mounted displays, including head-mounted displays used in virtual reality systems. Most virtual reality displays use a planar display and a lens system to focus the display image onto each eye. The lenses used in such devices tend to have a low focal ratio (f-number), which is the ratio of the lens's focal length to the diameter of the entrance pupil. As a result, head-mounted displays tend to be physically large due to the thick, low f-number, display-sized lenses and the long optical path lengths required for these lenses.

In addition, the field of view angle achieved in current VR display systems is limited to about half the normal human field of view angle (i.e. 100 degrees vs. 200 degrees). Having a small field of view tends to limit the effectiveness of the stereoscopic effect. To increasing the field of view for a typical lens system requires increasing the size of the display screen, increasing the diameter of the lens, or decreasing the focal length. Increasing the field of view in a head-mounted display complicates the optical design and increases cost.

The techniques described herein provide a display that is able to focus the projected image onto the wearer's pupil without the use of a lens. The display includes an array of light emitting diodes (LEDs), each of which is configured to project light at a predefined angle toward the wearer's pupil. The projection angle of each LED is controlled by adapting the physical shape of the LED surface. In this way, the lenses included in most VR systems can be eliminated and the size of the display may be reduced and moved closer to the wearer's eye. This may result in a head-mounted display for virtual reality that is lighter and more comfortable to wear. Furthermore, while the disclosed techniques may be applied to head-mounted displays for virtual reality systems, the techniques disclosed herein can be used in any type of display that would benefit from the ability to direct the projected image in a non-normal direction.

Furthermore, in the present disclosure, the term "reflect" is used to refer to any phenomenon by which a material changes the direction of light, including what is sometimes referred to as "refraction." Thus, the micro-reflectors described herein may operate according to principles of reflection, refraction, or a combination of both.

In the following description and claims, the terms "coupled" and "connected," along with their derivatives, may be used. It should be understood that these terms are not intended as synonyms for each other. Rather, in particular embodiments, "connected" may be used to indicate that two or more elements are in direct physical or electrical contact with each other. "Coupled" may mean that two or more elements are in direct physical or electrical contact. However, "coupled" may also mean that two or more elements are not in direct contact with each other, but yet still co-operate or interact with each other.

FIG. 1 is a cross sectional view of an LED display panel. The LED display panel 100 includes an array of LEDs 102 disposed on a supporting substrate 104. Each pixel of the display panel 100 includes a number of these LEDs, also referred to as micro LEDs. The supporting substrate 104 may include a Thin Film Transistor (TFT) backplane for activating the LEDs 102. For the sake of simplicity, only a single column of LEDs is shown in FIG. 1. However, it will be appreciated that the display panel 100 will include a two dimensional array of LEDs 102. Furthermore, each pixel of the display will include multiple LEDs, one for each of the colors to be generated. For example, in a Red-Green-Blue (RGB) display, each pixel will include at least a red LED, a green LED, and a blue LED. Other color combinations are also possible. Furthermore, it will be appreciated that the FIG. 1 is not drawn to scale and that an actual display panel will include many more LEDs than are shown in FIG. 1 and that the LEDs 102 will in reality be much smaller than depicted. In an example embodiment, the pixel array may be a 600×800 pixel array, 960×1080 pixel array, 1280×1440 pixel array, or any other suitable array size depending on the desired resolution.

As shown in FIG. 1, each of the LEDs 102 is configured to exhibit a beam angle that focuses the emitted light toward the pupil of the wearer. The particular beam angle specified for an LED 102 will depend on its location on the display panel 100. Pixels near the center of the display may include LEDs with a beam angle that is normal to the display panel surface, while pixels that are progressively positioned away from the center will include LEDs with a progressively larger beam angle to focus the light toward the pupil.

In some examples, neighboring LEDs may be grouped into pixel bins 106, wherein each LED 102 within a pixel bin 106 exhibits the same beam angle. Grouping pixels into bins may simplify the fabrication process by limiting the number of different LED types that are fabricated. The pixels of the display panel 100 may be grouped into any suitable number of pixel bins 106. In some example embodiments, the pixels are not grouped into pixel bins, and each LED exhibits a different radiation angle that depends on its position on the display panel 100.

To fabricate the display panel 100, the LEDs 102 may be fabricated on separate wafers and transferred from the wafers to the TFT backplane. The transfer process may be repeated for each LED color. The beam angle of each LED 102 is controlled by controlling the shape and/or composition of the LED. In this way, the beam angle of the light emitted by each LED 102 can be controlled without using a lens. Some examples of LEDs with built-in features that enable the LEDs to exhibit a specified beam angle are described below in relation to FIGS. 2-7.

Figure 2:
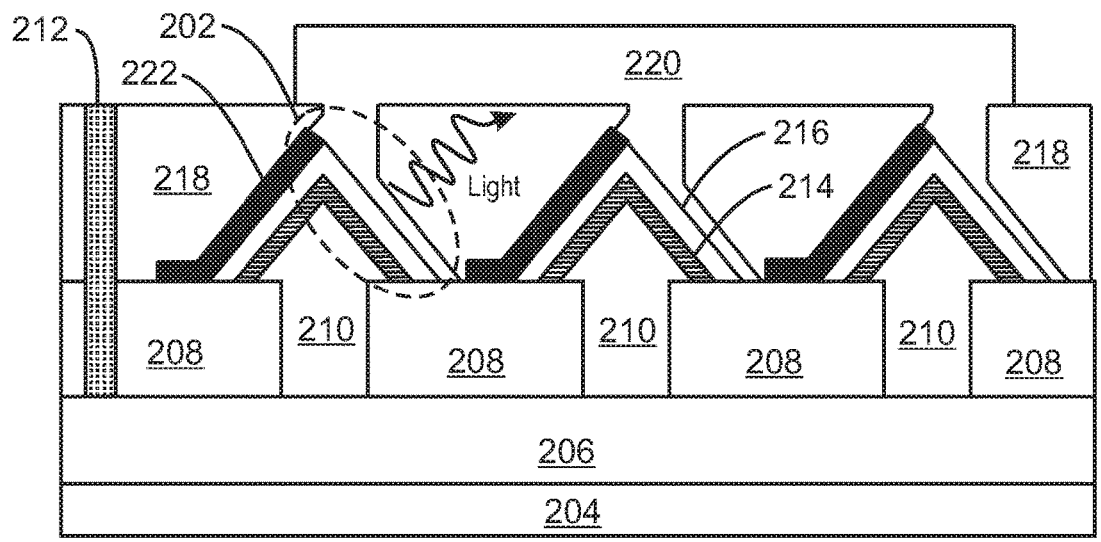
FIG. 2 is a cross sectional view of an example LED with built-in features that enable the LED to exhibit a specified beam angle.

FIG. 2 is a cross sectional view of an example LED with built-in features that enable the LED to exhibit a specified beam angle. The LED 200 may be fabricated using any suitable semiconductor fabrication techniques. For example, the creation of various structures may be accomplished though deposition, removal, and patterning of structures. Deposition techniques include techniques such as chemical vapor deposition, electrochemical deposition, and others. The patterning of various features may be accomplished through the use of photolithography. Modification of the electrical properties of the various structures may be accomplished using doping techniques such as ion implantation.

The LED 200 is made of several separate light emitting elements 202. In FIG. 2, three light emitting elements are shown. However, in an actual implementation, the LED can include any suitable number of light emitting elements 202, including 1, 2, 4, or more. The LED 200 includes a substrate 204 such as sapphire ($Al_2O_3$) or silicon carbide, for example. An N-type layer 206 is disposed over the substrate 204, and an insulator 208 such as Silicon Nitride ($Si_3N_4$) is disposed over the N-type layer 206. The insulator 208 includes several vias 210, each of which is filled with the same N-type material as the N-type layer 206 and couples one of the light emitting elements 202 to the N-type layer 206. Another via 212 contains a conductive material such as metal that enables electrical contact with the N-type layer 206.

Each radiating element 202 projects from the surface of the insulator 208 and includes a quantum well layer 214 disposed over the N-type material. The quantum well layer 214 is the light emitting layer and may be a Multiple Quantum Well (MQL) that includes alternating layers of active material. The light emitting elements 202 also include a P-type layer 216 disposed over the quantum well layer 214.

The P-type layer 106, N-type layer 108, and the quantum well layer 104 layer may all be formed by epitaxial growth processes. The layers of the LED 200 may be made of various types of material. In one example embodiment, the N-type layer 206 is N-doped Gallium Nitride (GaN), the P-type layer is P-doped Gallium Nitride, and the quantum well layer 214 is made of indium gallium nitride or alternating layers of gallium nitride and indium gallium nitride. However, other material combinations may be possible.

Another insulator 218 such as Silicon Nitride ($Si_3N_4$) may be disposed over the radiative elements to form a flat planar surface. A P-type metal electrode 220 may be disposed over the insulator 218. The P-type metal electrode 220 also extends through the insulator 218 and contacts a portion of the P-type layer 216 on one side of each of the light emitting elements 202. In this way, the P-type metal electrode 220 provides an electrical contact with the P-type layer 216. The application of a sufficient voltage to the P-type metal electrode 220 and the N-type via 212 will cause the quantum well layer 214 to emit light. The insulator 218 and the metal electrode 220 are formed from material that is substantially transparent, so that the light emitted by the quantum well layer 214 passed through those layers.

The intensity level of the light passing through the P-type metal electrode 220 will be more intense in the direction normal to the plane of the P-type layer 216 on the side that has the metal electrode 220. The illumination pattern, e.g. beam angle, of the LED 200 may be controlled, in part, by controlling the slope and height of the light emitting elements 202. In some example embodiments, an additional reflective layer 222 is disposed on the P-type layer 216 on the opposite side from the metal electrode 220. The reflective layer 222 may be a reflective metal that reflects light that would otherwise tend to be radiated from the quantum well layer 214 on the opposite side from the metal electrode 220. In this way, the reflective layer 222 helps to increase the directionality of the light radiated by the LED 200. The reflective layer 222 is optional and may be a thin layer of any suitable metal. For example, the reflective layer 222 may be a copper layer approximately 5 to 10 nanometers thick.

Figure 3:
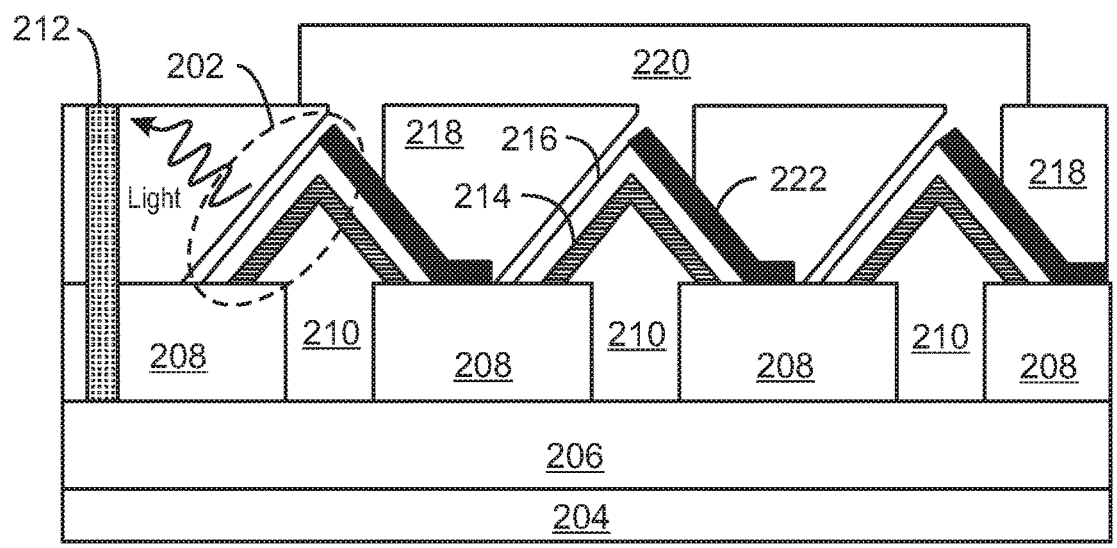
FIG. 3 is a cross sectional view of another example LED with built-in features that enable the LED to exhibit a specified beam angle.

FIG. 3 is a cross sectional view of another example LED with built-in features that enable the LED to exhibit a specified beam angle. The LED 300 of FIG. 3 is substantially the same as the LED 200 of FIG. 2. The LED 300 includes the substrate 204, the N-type layer 206 disposed over the substrate 204, and the insulator 208 with the vias 210 that couple the N-type layer 206 to each of the one of the light emitting elements 202. As mentioned above, the LED 300 can include any suitable number of light emitting elements 202.

As in FIG. 2, each radiating element 202 projects from the surface of the insulator 208 and includes a quantum well layer 214 disposed over the N-type material, and a P-type layer 216 disposed over the quantum well layer 214. The layers of the LED 300 may be made of the same types of material as discussed above with regard to the LED 200 of FIG. 2.

In comparison to the LED 200 of FIG. 2, the P-type metal electrode 220 contacts the opposite side of the P-type layer 216. Thus, assuming that the radiating element 202 has the same shape in FIG. 2 and FIG. 3, the radiation angle of the LED 300 will be of the same degree but in the opposite direction compared to the radiation angle of LED 200.

Figure 4:
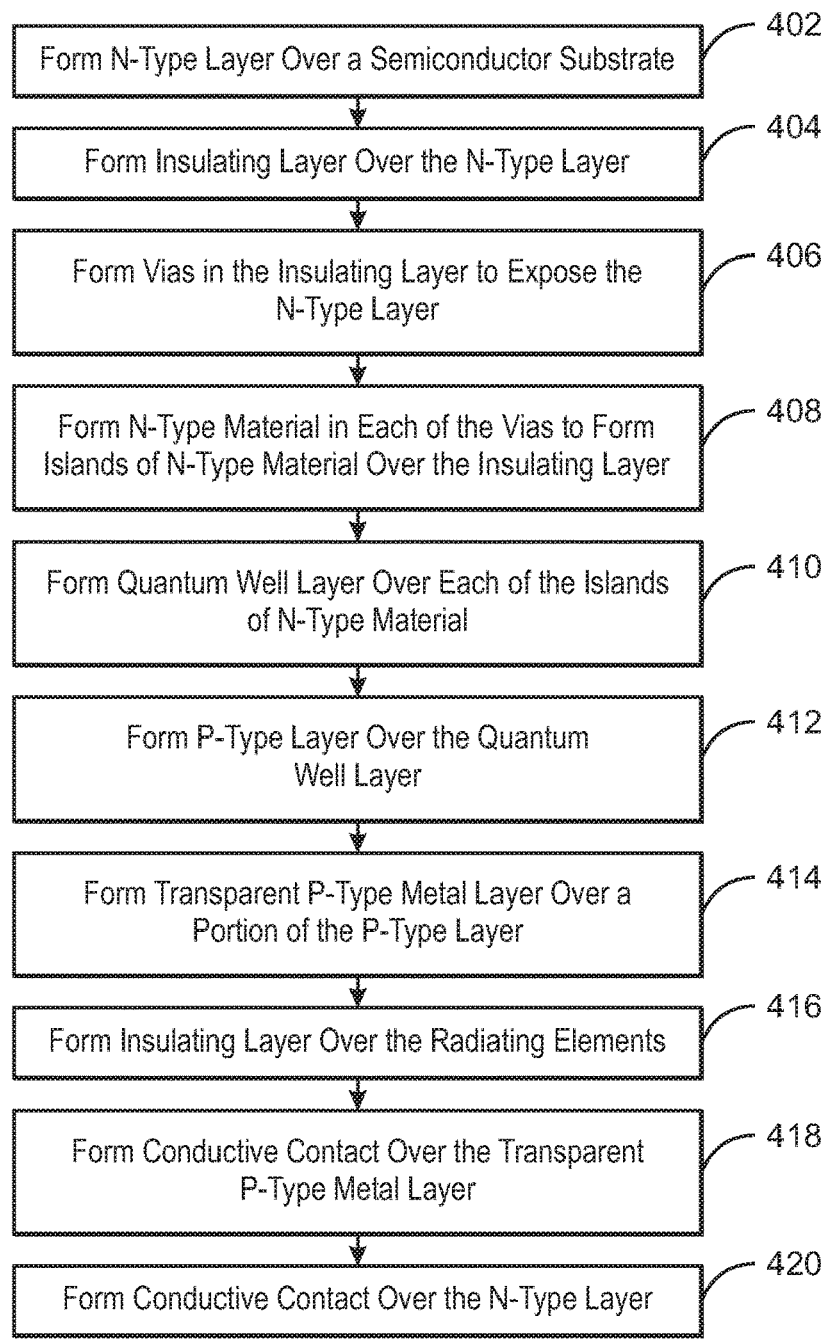
FIG. 4 is a process flow diagram summarizing an example method of fabricating an LED with built-in features that enable the LED to exhibit a specified beam angle.

FIG. 4 is a process flow diagram summarizing an example method of fabricating an LED with built-in features that enable the LED to exhibit a specified beam angle. The LED 200 shown in FIG. 2 and the LED 300 shown in FIG. 3 are examples of LEDs that may be fabricated using the method 400. The method 400 may begin at block 402.

At block 402, an N-type layer is formed over a semiconductor substrate.

At block 404, an insulating layer is formed over the N-type layer.

At block 406, a number of vias are formed in the insulating layer to expose the N-type layer below. Each via will serve as the site of a separate radiating element. Therefore, the number and arrangement of vias may be chosen depending on the desired number and arrangement of light emitting elements.

At block 408, N-type material is formed in each of the vias. The N-type material may be formed so as to project above the surface of the insulating layer to form islands of N-type material over the insulating layer. The islands of N-type material are electrically isolated from one another. The shape and height of the islands may be controlled during formation to provide a predetermined shape and height that will provide a desired radiation pattern, e.g., a desired light beam angle.

At block 410, a quantum well layer is formed over each of the islands of N-type material. As mentioned above, the quantum well layer may be a Multiple Quantum Well (MQL) that includes alternating layers of active material.

At block 412, a P-type layer is formed over the quantum well layer.

At block 414, a transparent P-type metal layer is formed over the P-type layer to provide an electrical contact with the P-type layer below. The transparent P-type metal layer can serve as an electrical contact to the P-type layer below and enables the LED to be activated. As shown in FIGS. 2 and 3, the transparent P-type metal layer may be disposed over one side of the radiating element depending on the desired direction of the LEDs radiation pattern. Optionally, a reflective metal layer may be disposed on the other side of the radiating element.

At block 416, an insulating layer is formed over the light emitting elements. The insulating layer may provide the LED with a flat planar surface above the light emitting elements.

At block 418, a conductive contact is formed over the transparent P-type metal layer formed at block 414. The conductive contact serves as an electrical contact for energizing the LED by applying a voltage. In an example embodiment, the conductive contact is formed by forming vias in the insulating layer to expose the transparent P-type metal layer below, and forming transparent P-type metal in each of the vias. A conductive contact pad may then be formed over the insulative layer so as to couple to the transparent P-type metal in each of the vias. The material used for the vias and the contact pad may be substantially transparent and may be the same as the transparent P-type metal formed in block 414.

At block 420, a conductive contact is formed over the N-Type layer. For example, another via structure may be formed in the insulating layers to expose the N-type layer below. A conductive material may then be formed in the via structure to create the conductive contact.

The method 400 should not be interpreted as meaning that the blocks are necessarily performed in the order shown. Furthermore, fewer or additional actions can be included in the method 400 depending on the design considerations of a particular implementation.

Figure 5:
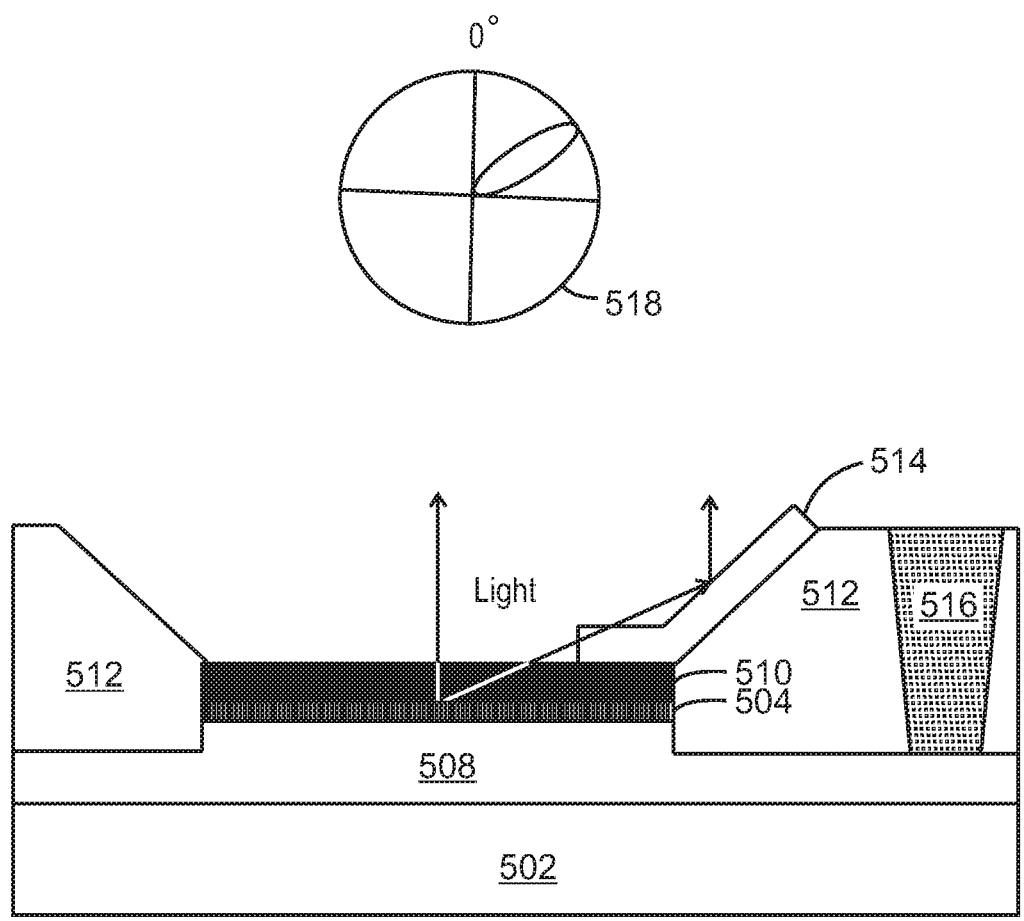
FIG. 5 is a cross sectional view of another example LED with built-in features that enable the LED to exhibit a specified beam angle.

FIG. 5 is a cross sectional view of another example LED with built-in features that enable the LED to exhibit a specified beam angle. The example LED 500 includes a substrate layer 502 and a quantum well layer 504 disposed between an N-type layer 508 and a P-type layer 510. The P-type layer 510 serves as a transparent window and allows light to be emitted from the quantum well layer 504. The fabrication techniques described above in relation to FIG. 2 may also apply to the layers of the LED 500. In one example embodiment, the substrate 204 is sapphire ($Al_2O_3$), the N-type layer 508 is N-doped Gallium Nitride, the P-type layer 510 is P-doped Gallium Nitride, and the quantum well layer 504 is made of indium gallium nitride or alternating layers of gallium nitride and indium gallium nitride. Other material combinations may be possible.

The LED 500 also includes an oxide layer 512 disposed around the outer circumference of the quantum well 504 and the P-type layer 510. The height of the oxide layer 512 above the P-type layer 510 causes the surface of the P-type layer 510 to sit at the base of a depression with sloping walls. A conductive layer 514 is disposed along the walls of the depression over a portion of the depression's circumference. The conductive layer 514 serves as the P-type electrical contact and also serves to reflect the light emitted by the quantum well layer 504. In some examples, the conductive layer 514 is transparent. Contact with the N-type layer 508 is enabled through a contact via 516. The conductive layers 514 and 516 may be made of a metal such as Indium-Tin-Oxide (ITO), Zinc Oxide (ZnO), or doped versions of ZnO (i.e., doped with Sulfur, Aluminum, etc).

In the example LED 500 of FIG. 5, the beam angle of the LED 500 may be controlled, in part, by controlling the slope and the height of the conductive layer 514 and the coverage of the conductive layer 514 along the walls of the depression. For example, the arrangement shown in FIG. 5 will cause the light radiated by the LED 500 to be directed toward the edge of the depression that has the conductive layer 514 (i.e., cathode to anode). An example radiation pattern that may be expected for the LED 500 is shown as graph 518. The graph 518 shows the relative illumination intensity at different values of angular displacement. Zero degrees represents the direction normal to the surface of the LED 500. The beam angle of the LED 500 may be adjusted by adjusting the depth of the depression and the slope of the depression walls. For example, the beam angle of the LED 500 may be increased by increasing the depth of the depression and the slope of the depression walls, and the beam angle of the LED 500 may be decreased by reducing the depth of the depression and the slope of the depression walls.

Figure 6:
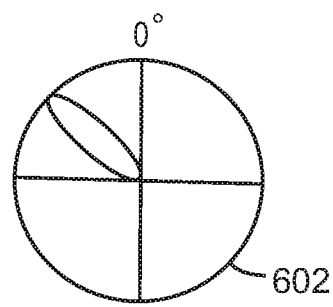
FIG. 6 is a cross sectional view of another example LED with built-in features that enable the LED to exhibit a specified beam angle.
Figure 6:
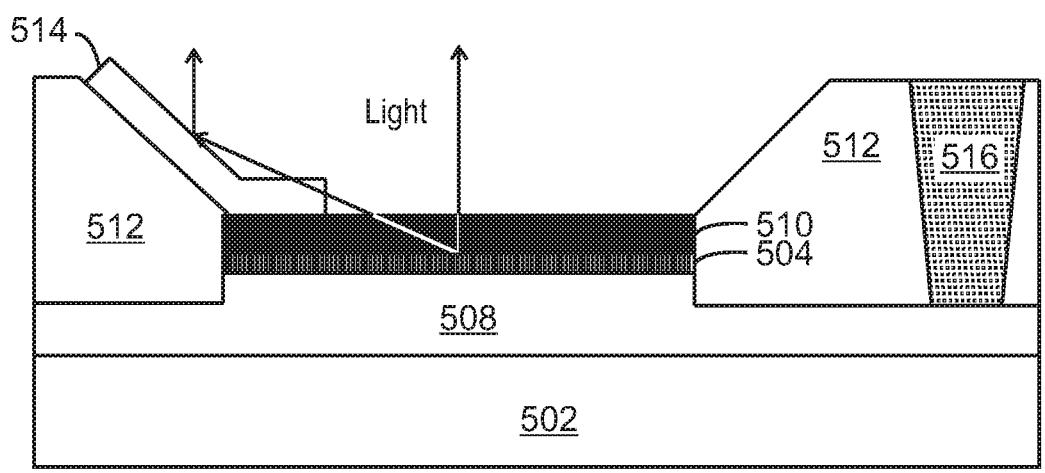

FIG. 6 is a cross sectional view of another example LED with built-in features that enable the LED to exhibit a specified beam angle. The LED 600 of FIG. 6 is substantially the same as the LED 500 of FIG. 5. The LED 600 includes the substrate layer 502, quantum well layer 504, an N-type layer 508, and P-type layer 510, all of which are substantially the same as discuss above in regard to FIG. 5. The LED 600 also includes the oxide layer 512 disposed around the outer circumference of the quantum well 504 and P-type layer 510 to form a depression with sloping walls around the P-type layer 510. The layers of the LED 600 may be made of the same types of material as discussed above with regard to the LED 500 of FIG. 5.

As in the LED 500 of FIG. 5, a conductive layer 514 is disposed along the walls of the depression over a portion of the depression's circumference. However, compared to the LED 500, the conductive layer 514 is disposed on the opposite side of the depression's walls. Thus, assuming that the depression has the same shape as in FIG. 5, the beam angle of the LED 600 will be of the same degree but in the opposite direction compared to the beam angle of LED 500. An example radiation pattern that may be expected for the LED 600 is shown as graph 602. Zero degrees represents the direction normal to the surface of the LED 600.

Figure 7:
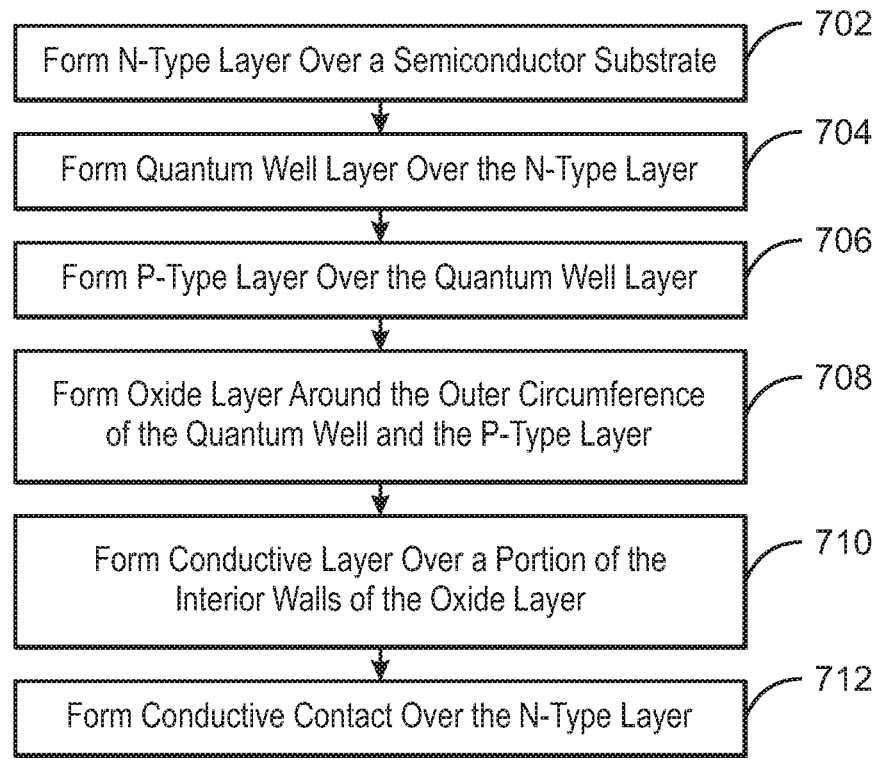
FIG. 7 is a process flow diagram summarizing another example method of fabricating an LED with built-in features that enable the LED to exhibit a specified beam angle.

FIG. 7 is a process flow diagram summarizing another example method of fabricating an LED with built-in features that enable the LED to exhibit a specified beam angle. The LED 500 and LED 600 shown in FIGS. 5 and 6 are examples of an LED that may be fabricated using the method 700. The method 700 may begin at block 702.

At block 702, an N-type layer is formed over a semiconductor substrate.

At block 704, a quantum well layer is formed over the N-type layer. As mentioned above, the quantum well layer may be a Multiple Quantum Well (MQL) that includes alternating layers of active material.

At block 706, a P-type layer is formed over the quantum well layer. In some examples, forming the P-type layer includes forming an etch stop layer over the quantum well layer and forming a window layer over the etch stop layer. In other examples, forming the P-type layer includes forming the window layer directly over the quantum well layer and the etch stop layer is omitted.

At block 708, an oxide layer is formed around the outer circumference of the quantum well and the P-type layer, which includes the window layer. The oxide layer may be formed to extend above the height of the P-type layer so that the interior walls of the oxide layer surrounding the P-type layer are sloped. The formation of the interior walls of the oxide layer may be controlled to form a specified height and slope angle. The specified height and slope angle may selected to provide a desired illumination pattern with a desired beam angle.

At block 710, a conductive layer is formed over a portion of the interior walls of the oxide layer. The conductive layer may also contact a portion of the top surface of the P-type layer so that the conductive layer can serve as electrical contact to the P-type layer that enables the LED to be activated. As explained above in relation to FIGS. 5 and 6, the beam angle of the LED may be controlled, in part, by controlling the portion of the interior walls that is covered by the conductive layer.

At block 712, a conductive contact is formed over the N-Type layer. For example, a via structure may be formed in the oxide layer to expose the N-type layer below. A conductive material may then be formed in the via structure to create the conductive contact.

The method 700 should not be interpreted as meaning that the blocks are necessarily performed in the order shown. Furthermore, fewer or additional actions can be included in the method 700 depending on the design considerations of a particular implementation.

Figure 8:
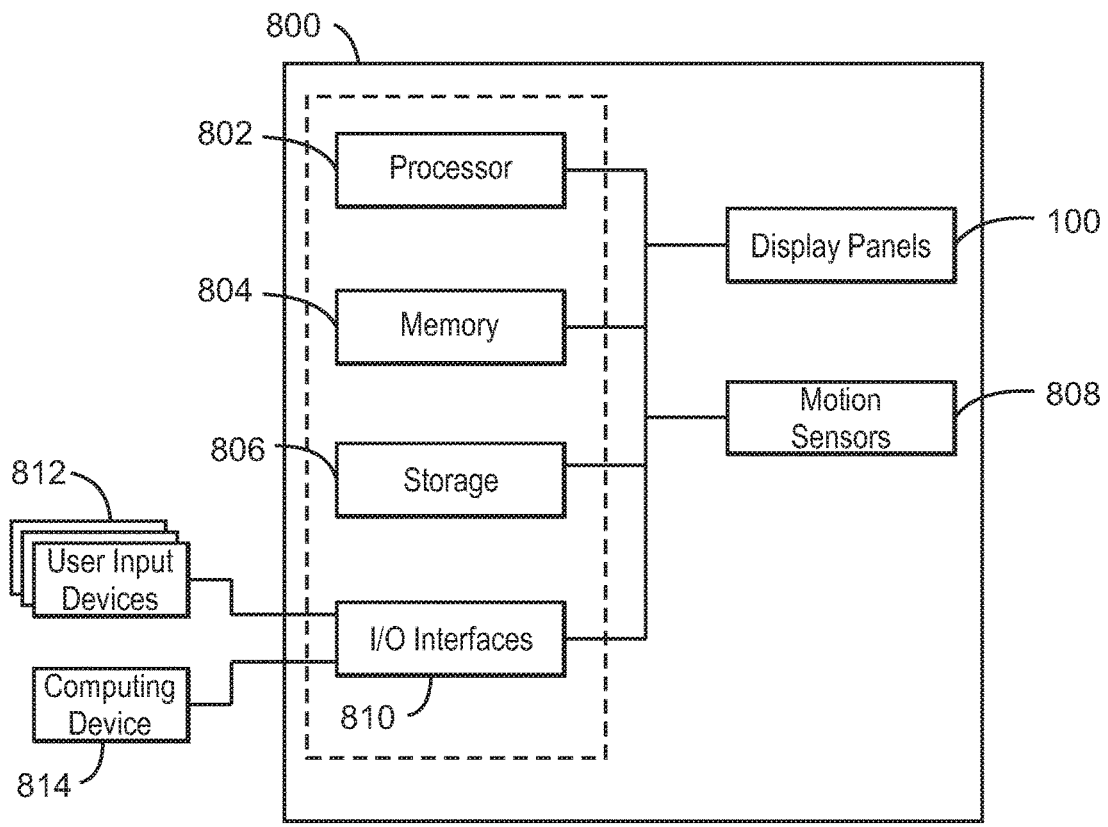
FIG. 8 is a block diagram of a head-mounted display equipped with the display panel 100 of FIG. 1.

FIG. 8 is a block diagram of a head-mounted display equipped with the display panel 100 of FIG. 1. The head-mounted display 800 may be a virtual reality device or any other type of head-mounted display. The head-mounted display 800 may include a processor 802 that is configured to execute stored instructions, as well as a memory device 804 that stores instructions that are executable by the processor 802. The processor 802 may be coupled to the memory device 804 by a bus 806. The processor 802 may be a single core processor, a multi-core processor, a computing cluster, or any number of other configurations. The processor 802 may be implemented as a Complex Instruction Set Computer (CISC) processor, a Reduced Instruction Set Computer (RISC) processor, x86 Instruction set compatible processor, or any other microprocessor or central processing unit (CPU). In some embodiments, the processor 802 includes dual-core processor(s), dual-core mobile processor(s), or the like.

The memory device 804 may include random access memory (e.g., SRAM, DRAM, zero capacitor RAM, SONOS, eDRAM, EDO RAM, DDR RAM, RRAM, PRAM, etc.), read only memory (e.g., Mask ROM, PROM, EPROM, EEPROM, etc.), flash memory, or any other suitable memory system. The memory device 804 can be used to store data and computer-readable instructions that, when executed by the CPU processor, direct the processor 802 to perform various operations in accordance with embodiments described herein. The processor 802 may be configured to perform any number of graphics rendering operations.

The head-mounted display 800 may also include a storage device 806. The storage device 806 is a physical memory device such as a flash drive or an array of flash drives, or any combinations thereof. The storage device 806 may store programming code such as device drivers, software applications, operating systems, and the like. The programming code stored by the storage device 806 may be executed by the processor 802.

The head-mounted display 800 also includes one or more motion sensors 808. Examples of motion sensors include accelerometers, gyroscopes, and others. The motion sensors 808 detect movements of the wearer's head and use the motion information to determine a perspective of the user with respect to the virtual environment.

The head-mounted display 800 may also include an input/output (I/O) interfaces 810 configured to connect the head-mounted display 800 to one or more user input devices 812. For example, the user input devices 812 may include a game controller, pointing device, and others. The user input devices 812 may be built-in components of the head-mounted display 800, or may be devices that are externally connected to the head-mounted display 800. The user input devices 812 may be used to enable the user to interact with objects in the virtual environment.

The I/O interfaces 810 may also include one or more interfaces for communicating with a computing device, such as a computer, tablet or smart phone. The I/O interfaces may include wired or wireless interfaces, including Universal Serial Bus (USB), High-Definition Multimedia Interface (HDMI), Bluetooth, WiFi, PCI Express (Peripheral Component Interconnect Express), and others. In some example embodiments, data from the motion sensors 808 and user input devices 812 is sent to the computing device 814, which renders video images based on this information and sends the video images back to the head-mounted display 800 for rendering. In some example embodiments, the head-mounted display itself processes data from the motion sensors 808 and user input devices 812 and generates the video images based on its own internal programming, in which case, the connection with the computing device 814 may not be needed.

The head-mounted display 800 also includes display panels 100. The display panels include LEDs that are able to focus an image on the user's pupils without the use of a lenses. Examples of such LEDs are described above in relation to FIGS. 2-7. The head-mounted display 800 may include two display panels, one for each eye.

The block diagram of FIG. 8 is not intended to indicate that the computing device 800 is to include all of the components shown in FIG. 8. Rather, the computing system 800 can include fewer or additional components not shown in FIG. 8, depending on the details of the specific implementation. For example, the functionality may be implemented in any combination of Application Specific Integrated Circuits (ASICs), Field Programmable Gate Arrays (FPGAs), logic circuits, and the like. In addition, components of the head-mounted display can be implemented in ultra-compact form factor devices, such as System-On-a-Chip (SOC), and multi-chip modules.

Examples

Example 1 is a head-mounted display. The head-mounted display includes a display panel with an array of Light Emitting Diodes (LEDs) that are controllable to form an image; circuitry to receive image data and render an image on the display panel; and circuitry to detect motion of the head-mounted display. The image data is generated based in part on the motion of the head-mounted display. Each LED in the array of LEDs is configured to emit light at a specified beam angle that directs the light toward a pupil of a wearer of the head-mounted display.

Example 2 includes the head-mounted display of example 1, including or excluding optional features. In this example, light from the display panel is directed toward the pupil of the wearer without the use of a lens system.

Example 3 includes the head-mounted display of any one of examples 1 to 2, including or excluding optional features. In this example, the LEDs are grouped into pixel bins, each pixel bin including LEDs that exhibit a same beam angle.

Example 4 includes the head-mounted display of any one of examples 1 to 3, including or excluding optional features. In this example, the specified beam angle is determined based on a shape of the LED.

Example 5 includes the head-mounted display of any one of examples 1 to 4, including or excluding optional features. In this example, at least one of the LEDs includes: an N-type layer disposed over a semiconductor substrate; an insulator layer disposed above the N-type layer; a plurality of light emitting elements projecting above a surface of the insulator layer, wherein the plurality of light emitting elements is isolated from each other. Each of the light emitting elements includes: a light emitting layer; a P-type layer disposed over the light emitting layer; and a transparent P-type metal layer disposed over a portion of the P-type layer. Optionally, the head-mounted display includes a plurality of N-type through vias disposed in the insulator layer, wherein each one of the plurality of N-type through vias couples the N-type layer to a respective one of the plurality of light emitting elements. Optionally, a shape of the light emitting elements is controlled to generate the specified beam angle.

Example 6 includes the head-mounted display of any one of examples 1 to 5, including or excluding optional features. In this example, at least one of the LEDs includes: a light emitting layer; a window layer that includes transparent semiconductor material disposed over the light emitting layer; and an oxide layer disposed around an outer circumference of the window layer to form a depression with sloping walls, wherein the window layer sits at a base of the depression. The LED also includes a conductive layer disposed over the oxide layer along a portion of the sloping walls of the depression. The conductive layer forms a reflective surface that reflects light emitted through the window layer. Optionally, a slope of the sloping walls of the depression is controlled to generate the specified beam angle. Optionally, the portion of the sloping walls covered by the conductive layer is selected to generate the specified beam angle.

Example 7 is a display panel. The display panel includes a plurality of pixels that are controllable to form an image. Each pixel includes a plurality of Light Emitting Diodes (LEDs). The display panel also includes a Thin Film Transistor (TFT) backplane to activate the LEDs. Each LED in the plurality of LEDs is configured to emit light at a specified beam angle to direct the light toward a viewer's pupil.

Example 8 includes the display panel of example 7, including or excluding optional features. In this example, light from the display panel is directed toward the viewer's pupil without the use of a lens system.

Example 9 includes the display panel of any one of examples 7 to 8, including or excluding optional features. In this example, the LEDs are grouped into pixel bins, each pixel bin including LEDs that exhibit a same beam angle.

Example 10 includes the display panel of any one of examples 7 to 9, including or excluding optional features. In this example, the specified beam angle is determined based on a shape of the LED.

Example 11 includes the display panel of any one of examples 7 to 10, including or excluding optional features. In this example, at least one of the LEDs includes: an N-type layer disposed over a semiconductor substrate; an insulator layer disposed above the N-type layer; and a plurality of light emitting elements projecting above a surface of the insulator layer. The plurality of light emitting elements is isolated from each other. Each of the light emitting elements includes: a light emitting layer; a P-type layer disposed over the light emitting layer; and a transparent P-type metal layer disposed over the P-type layer. Optionally, the display panel includes a plurality of N-type through vias disposed in the insulator layer, wherein each one of the plurality of N-type through vias couples the N-type layer to a respective one of the plurality of light emitting elements. Optionally, a shape of the light emitting elements is controlled to generate the specified beam angle.

Example 12 includes the display panel of any one of examples 7 to 11, including or excluding optional features. In this example, at least one of the LEDs includes: a light emitting layer; a window layer that includes a transparent semiconductor material disposed over the light emitting layer; and an oxide layer disposed around an outer circumference of the window layer to form a depression with sloping walls, wherein the window layer sits at a base of the depression. The display panel also includes a conductive layer disposed over the oxide layer along a portion of the sloping walls of the depression. The conductive layer forms a reflective surface that reflects light emitted through the window layer. Optionally, a slope of the sloping walls of the depression is controlled to generate the specified beam angle. Optionally, the portion of the sloping walls covered by the conductive layer is selected to generate the specified beam angle.

Example 13 is a method of fabricating a Light Emitting Diode (LED) for a display panel, the method. The method includes forming an N-type layer over a semiconductor substrate; forming an insulator layer over the N-type layer; and forming a plurality of light emitting elements that project above a surface of an insulator. The plurality of light emitting elements are isolated from each other. Forming each light emitting element of the plurality of light emitting elements includes: forming a light emitting layer; forming a P-type layer over the light emitting layer; and forming a transparent P-type metal layer over a portion of the P-type layer. Forming the plurality of light emitting element also includes controlling a shape of the light emitting elements to produce a specified beam angle.

Example 14 includes the method of example 13, including or excluding optional features. In this example, forming the plurality of light emitting elements includes forming a plurality of N-type through vias in the insulator layer, and forming each one of the plurality of light emitting elements over a respective one of the plurality of N-type through vias.

Example 15 includes the method of any one of examples 13 to 14, including or excluding optional features. In this example, the LED is configured to be activated by applying a charge to the transparent P-type metal layer.

Example 16 is a method of fabricating a Light Emitting Diode (LED) for a display panel. The method includes forming a light emitting layer and forming a window layer over the light emitting layer, wherein the window layer includes transparent semiconductor material. The method also includes forming an oxide layer around an outer circumference of the window layer to form a depression with sloping walls, wherein the window layer sits at a base of the depression. The method also includes forming a conductive layer over the oxide layer along a portion of the sloping walls of the depression, wherein the conductive layer forms a reflective surface that reflects light emitted through the window layer.

Example 17 includes the method of example 16, including or excluding optional features. In this example, forming the oxide layer includes controlling a slope of the sloping walls to generate a specified beam angle.

Example 18 is an apparatus for generating a display image. The apparatus includes means for receiving image data and controlling an array of Light Emitting Diodes (LEDs) to render an image. The apparatus also includes means for detecting motion of a user's head. The image data is generated based in part on the motion. Each LED in the array of LEDs is configured to emit light at a specified beam angle that directs the light toward a pupil of a viewer.

Example 19 includes the apparatus of example 18, including or excluding optional features. In this example, light from the array of LEDs is directed toward the pupil of the viewer without the use of a lens system.

Example 20 includes the apparatus of any one of examples 18 to 19, including or excluding optional features. In this example, the array of LEDs are grouped into pixel bins, each pixel bin including LEDs that exhibit a same beam angle.

Example 21 includes the apparatus of any one of examples 18 to 20, including or excluding optional features. In this example, the specified beam angle is determined based on a shape of each LED in the array of LEDs.

Example 22 includes the apparatus of any one of examples 18 to 21, including or excluding optional features. In this example, at least one of the LEDs in the array of LEDs includes: an N-type layer disposed over a semiconductor substrate; an insulator layer disposed above the N-type layer; and a plurality of light emitting elements projecting above a surface of the insulator layer. The plurality of light emitting elements are isolated from each other. Each of the light emitting elements includes: a light emitting layer; a P-type layer disposed over the light emitting layer; and a transparent P-type metal layer disposed over a portion of the P-type layer. Optionally, the apparatus includes a plurality of N-type through vias disposed in the insulator layer, wherein each one of the plurality of N-type through vias couples the N-type layer to a respective one of the plurality of light emitting elements. Optionally, a shape of the light emitting elements is controlled to generate the specified beam angle.

Example 23 includes the apparatus of any one of examples 18 to 22, including or excluding optional features. In this example, at least one of the LEDs in the array of LEDs includes a light emitting layer and a window layer that includes transparent semiconductor material disposed over the light emitting layer. The LED also includes an oxide layer disposed around an outer circumference of the window layer to form a depression with sloping walls, wherein the window layer sits at a base of the depression. The LED also includes a conductive layer disposed over the oxide layer along a portion of the sloping walls of the depression, wherein the conductive layer forms a reflective surface that reflects light emitted through the window layer. Optionally, a slope of the sloping walls of the depression is controlled to generate the specified beam angle. Optionally, the portion of the sloping walls covered by the conductive layer is selected to generate the specified beam angle.

Example 24 is a display panel. The display panel includes a plurality of LEDs; and means for selectively activating the plurality of LEDs to form an image. Each LED in the plurality of LEDs is configured to emit light at a specified beam angle to direct the light toward a viewer's pupil.

Example 25 includes the display panel of example 24, including or excluding optional features. In this example, light from the display panel is directed toward the viewer's pupil without the use of a lens system.

Example 26 includes the display panel of any one of examples 24 to 25, including or excluding optional features. In this example, the plurality of LEDs are grouped into pixel bins, each pixel bin including LEDs that exhibit a same beam angle.

Example 27 includes the display panel of any one of examples 24 to 26, including or excluding optional features. In this example, the specified beam angle is determined based on a shape of the LED.

Example 28 includes the display panel of any one of examples 24 to 27, including or excluding optional features. In this example, at least one of the LEDs includes: an N-type layer disposed over a semiconductor substrate; an insulator layer disposed above the N-type layer; and a plurality of light emitting elements projecting above a surface of the insulator layer. The plurality of light emitting elements are isolated from each other. Each of the light emitting elements includes: a light emitting layer; a P-type layer disposed over the light emitting layer; and a transparent P-type metal layer disposed over the P-type layer. Optionally, the display panel includes a plurality of N-type through vias disposed in the insulator layer, wherein each one of the plurality of N-type through vias couples the N-type layer to a respective one of the plurality of light emitting elements. Optionally, a shape of the light emitting elements is controlled to generate the specified beam angle.

Example 29 includes the display panel of any one of examples 24 to 28, including or excluding optional features. In this example, at least one of the LEDs includes a light emitting layer and a window layer that includes a transparent semiconductor material disposed over the light emitting layer. The LED also includes an oxide layer disposed around an outer circumference of the window layer to form a depression with sloping walls, wherein the window layer sits at a base of the depression. The LED also includes a conductive layer disposed over the oxide layer along a portion of the sloping walls of the depression, wherein the conductive layer forms a reflective surface that reflects light emitted through the window layer. Optionally, a slope of the sloping walls of the depression is controlled to generate the specified beam angle. Optionally, the portion of the sloping walls covered by the conductive layer is selected to generate the specified beam angle.

Some embodiments may be implemented in one or a combination of hardware, firmware, and software. Some embodiments may also be implemented as instructions stored on the tangible, non-transitory, machine-readable medium, which may be read and executed by a computing platform to perform the operations described. In addition, a machine-readable medium may include any mechanism for storing or transmitting information in a form readable by a machine, e.g., a computer. For example, a machine-readable medium may include read only memory (ROM); random access memory (RAM); magnetic disk storage media; optical storage media; flash memory devices; or electrical, optical, acoustical or other form of propagated signals, e.g., carrier waves, infrared signals, digital signals, or the interfaces that transmit and/or receive signals, among others.

An embodiment is an implementation or example. Reference in the specification to "an embodiment," "one embodiment," "some embodiments," "various embodiments," or "other embodiments" means that a particular feature, structure, or characteristic described in connection with the embodiments is included in at least some embodiments, but not necessarily all embodiments, of the present techniques. The various appearances of "an embodiment," "one embodiment," or "some embodiments" are not necessarily all referring to the same embodiments.

Not all components, features, structures, characteristics, etc. described and illustrated herein need be included in a particular embodiment or embodiments. If the specification states a component, feature, structure, or characteristic "may", "might", "can" or "could" be included, for example, that particular component, feature, structure, or characteristic is not required to be included. If the specification or claim refers to "a" or "an" element, that does not mean there is only one of the element. If the specification or claims refer to "an additional" element, that does not preclude there being more than one of the additional element.

It is to be noted that, although some embodiments have been described in reference to particular implementations, other implementations are possible according to some embodiments. Additionally, the arrangement and/or order of circuit elements or other features illustrated in the drawings and/or described herein need not be arranged in the particular way illustrated and described. Many other arrangements are possible according to some embodiments.

In each system shown in a figure, the elements in some cases may each have a same reference number or a different reference number to suggest that the elements represented could be different and/or similar. However, an element may be flexible enough to have different implementations and work with some or all of the systems shown or described herein. The various elements shown in the figures may be the same or different. Which one is referred to as a first element and which is called a second element is arbitrary.

It is to be understood that specifics in the aforementioned examples may be used anywhere in one or more embodiments. For instance, all optional features of the computing device described above may also be implemented with respect to either of the method or the computer-readable medium described herein. Furthermore, although flow diagrams and/or state diagrams may have been used herein to describe embodiments, the techniques are not limited to those diagrams or to corresponding descriptions herein. For example, flow need not move through each illustrated box or state or in exactly the same order as illustrated and described herein.

The present techniques are not restricted to the particular details listed herein. Indeed, those skilled in the art having the benefit of this disclosure will appreciate that many other variations from the foregoing description and drawings may be made within the scope of the present techniques. Accordingly, it is the following claims including any amendments thereto that define the scope of the present techniques.

What is claimed is:

1. A head-mounted display comprising:
a display panel comprising an array of Light Emitting Diodes (LEDs) that are controllable to form an image;
circuitry to receive image data and render an image on the display panel; and
circuitry to detect motion of the head-mounted display, wherein the image data is generated based in part on the motion of the head-mounted display;
wherein each LED in the array of LEDs is configured to emit light at a specified beam angle that directs the light toward a pupil of a wearer of the head-mounted display and wherein at least one of the LEDs comprises:
a substrate;
a first doped semiconductor disposed over the substrate and forming a projection with sloped surfaces;
a light emitting layer disposed over the projection of the first doped semiconductor, wherein the beam angle is determined in part by a slope of the sloped surfaces;
a second doped semiconductor layer disposed over the light emitting layer; and
an electrode disposed over one side of the second doped semiconductor layer to cause an intensity of the light emitted from the light emitting layer to be higher in a direction normal to a plane of the one side that has the electrode.

2. The head-mounted display of claim 1, wherein light from the display panel is directed toward the pupil of the wearer without the use of a lens system.

3. The head-mounted display of claim 1, wherein the LEDs are grouped into pixel bins, each pixel bin comprising LEDs that exhibit a same beam angle.

4. The head-mounted display of claim 1, wherein the specified beam angle is determined based on a shape of the LED.

5. The head-mounted display of claim 1, comprising an insulator layer disposed over the first doped semiconductor, wherein the insulator layer comprises a plurality of through vias disposed in the insulator layer, and wherein the first doped semiconductor is disposed in the through via to form the projection.

6. The head-mounted display of claim 1, wherein a shape of the projection is controlled to generate the specified beam angle.

7. A head-mounted display comprising:
a display panel comprising an array of Light Emitting Diodes (LEDs) that are controllable to form an image;
circuitry to receive image data and render an image on the display panel; and
circuitry to detect motion of the head-mounted display, wherein the image data is generated based in part on the motion of the head-mounted display;
wherein each LED in the array of LEDs is configured to emit light at a specified beam angle that directs the light toward a pupil of a wearer of the head-mounted display; and wherein at least one of the LEDs comprises:

a light emitting layer and a window layer, the window layer comprising transparent semiconductor material disposed over the light emitting layer;

an oxide layer disposed around an outer circumference of the window layer to form a depression with sloping walls, wherein the window layer sits at a base of the depression; and a conductive layer disposed over the oxide layer along a portion of the sloping walls of the depression, wherein the conductive layer forms a reflective surface that reflects light emitted through the window layer.

8. The head-mounted display of claim 7, wherein a slope of the sloping walls of the depression is controlled to generate the specified beam angle.

9. The head-mounted display of claim 7, wherein the portion of the sloping walls covered by the conductive layer is selected to generate the specified beam angle.

10. A display panel comprising:

a plurality of pixels that are controllable to form an image, each pixel comprising a plurality of Light Emitting Diodes (LEDs); and a Thin Film Transistor (TFT) backplane to activate the LEDs;

wherein each LED in the plurality of LEDs is configured to emit light at a specified beam angle to direct the light toward a viewer's pupil, and wherein at least one of the LEDs comprises:

a substrate:

a first doped semiconductor disposed over the substrate and forming a projection with sloped surfaces;

a light emitting layer disposed over the projection of the first doped semiconductor, wherein the beam angle is determined in part by a slope of the sloped surfaces;

a second doped semiconductor layer disposed over the light emitting layer; and an electrode disposed over one side of the second doped semiconductor layer to cause an intensity of the light emitted from the light emitting layer to be higher in a direction normal to a plane of the one side that has the electrode.

11. The display panel of claim 10, wherein light from the display panel is directed toward the viewer's pupil without the use of a lens system.

12. The display panel of claim 10, wherein the LEDs are grouped into pixel bins, each pixel bin comprising LEDs that exhibit a same beam angle.

13. The display panel of claim 10, wherein the specified beam angle is determined based on a shape of the LED.

14. The display panel of claim 10, comprising an insulator layer disposed over the first doped semiconductor, wherein the insulator layer comprises a plurality of through vias disposed in the insulator layer, and wherein the first doped semiconductor is disposed in the through via to form the projection.

15. The display panel of claim 10, wherein a shape of the projection is controlled to generate the specified beam angle.

16. A display panel comprising:

a plurality of pixels that are controllable to form an image, each pixel comprising a plurality of Light Emitting Diodes (LEDs); and a Thin Film Transistor (TFT) backplane to activate the LEDs;

wherein each LED in the plurality of LEDs is configured to emit light at a specified beam angle to direct the light toward a viewer's pupil, and wherein at least one of the LEDs comprises:

a light emitting layer and a window layer, the window layer comprising transparent semiconductor material disposed over the light emitting layer;

an oxide layer disposed around an outer circumference of the window layer to form a depression with sloping walls, wherein the window layer sits at a base of the depression; and a conductive layer disposed over the oxide layer along a portion of the sloping walls of the depression, wherein the conductive layer forms a reflective surface that reflects light emitted through the window layer.

17. The display panel of claim 16, wherein a slope of the sloping walls of the depression is controlled to generate the specified beam angle.

18. The display panel of claim 16, wherein the portion of the sloping walls covered by the conductive layer is selected to generate the specified beam angle.

19. A method of fabricating a Light Emitting Diode (LED) for a display panel, the method comprising:

forming an N-type layer over a semiconductor substrate;

forming an insulator layer over the N-type layer; and forming a plurality of light emitting elements that project above a surface of an insulator, wherein the plurality of light emitting elements are isolated from each other, and wherein forming each light emitting element of the plurality of light emitting elements comprises:

forming a light emitting layer;

forming a P-type layer over the light emitting layer; and forming a transparent P-type metal layer over one side of the P-type layer to cause an intensity of the light emitted from the light emitting layer to be higher in a direction normal to a plane of the one side that has the transparent P-type metal layer;

wherein forming the plurality of light emitting element comprises controlling a shape of the light emitting elements to produce a specified beam angle.

20. The method of claim 19, wherein forming the plurality of light emitting elements comprises forming a plurality of N-type through vias in the insulator layer, and forming each one of the plurality of light emitting elements over a respective one of the plurality of N-type through vias.

21. The method of claim 19, wherein the LED is configured to be activated by applying a charge to the transparent P-type metal layer.

22. A method of fabricating a Light Emitting Diode (LED) for a display panel, the method comprising:

forming a light emitting layer;

forming a window layer over the light emitting layer, the window layer comprising transparent semiconductor material;

forming an oxide layer around an outer circumference of the window layer to form a depression with sloping walls, wherein the window layer sits at a base of the depression; and forming a conductive layer over the oxide layer along a portion of the sloping walls of the depression, wherein the conductive layer forms a reflective surface that reflects light emitted through the window layer.

23. The method of claim 22, wherein forming the oxide layer comprises controlling a slope of the sloping walls to generate a specified beam angle.

* * * * *